United States Patent
Kannari et al.

(10) Patent No.: US 9,048,384 B2
(45) Date of Patent: Jun. 2, 2015

(54) STEAM GENERATION APPARATUS

(71) Applicant: Sasakura Engineering Co., Ltd., Osaka-shi (JP)

(72) Inventors: Toru Kannari, Osaka (JP); Yoshiaki Miho, Osaka (JP)

(73) Assignee: Sasakura Engineering Co., Ltd., Osaka (JP)

( * ) Notice: Subject to any disclaimer, the term of this patent is extended or adjusted under 35 U.S.C. 154(b) by 346 days.

(21) Appl. No.: 13/760,848

(22) Filed: Feb. 6, 2013

(65) Prior Publication Data

US 2013/0206573 A1   Aug. 15, 2013

(30) Foreign Application Priority Data

Feb. 9, 2012   (JP) .................................. 2012-026475

(51) Int. Cl.
| | |
|---|---|
| H01L 35/30 | (2006.01) |
| C02F 1/04 | (2006.01) |
| F22B 1/00 | (2006.01) |
| F22B 1/06 | (2006.01) |
| F22B 37/78 | (2006.01) |

(52) U.S. Cl.
CPC . *H01L 35/30* (2013.01); *C02F 1/04* (2013.01); *F22B 1/006* (2013.01); *F22B 1/06* (2013.01); *F22B 37/78* (2013.01)

(58) Field of Classification Search
None
See application file for complete search history.

(56) References Cited

U.S. PATENT DOCUMENTS

2002/0179135 A1 * 12/2002 Shutoh et al. ................ 136/200

FOREIGN PATENT DOCUMENTS

WO   WO 2011/121852 A   10/2011

* cited by examiner

*Primary Examiner* — Susan D Leong
(74) *Attorney, Agent, or Firm* — Sterne, Kessler, Goldstein & Fox P.L.L.C.

(57) ABSTRACT

A steam generation apparatus 1 including a high-temperature pipe 10 disposed extending horizontally and through which a high-temperature fluid passes; low-temperature pipes 20 disposed on both sides of the high-temperature pipe 10 in a horizontal direction and through which a low-temperature fluid having a temperature lower than that of the high-temperature fluid passes; and a thermoelectric module 30 interposed between the high-temperature pipe 10 and each of the low-temperature pipes 20 for generating electrical power using a temperature difference between the high-temperature pipe 10 and the low-temperature pipes 20, the low-temperature pipes 20 being configured such that the supplied low-temperature fluid in a liquid form is turned into steam due to heat exchange with the high-temperature fluid and is discharged from an upper portion of the low-temperature pipes 20.

9 Claims, 4 Drawing Sheets

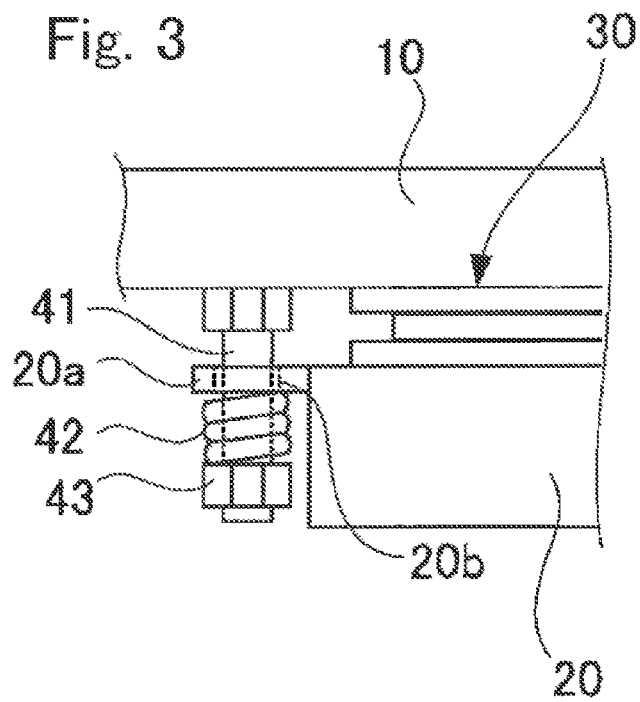
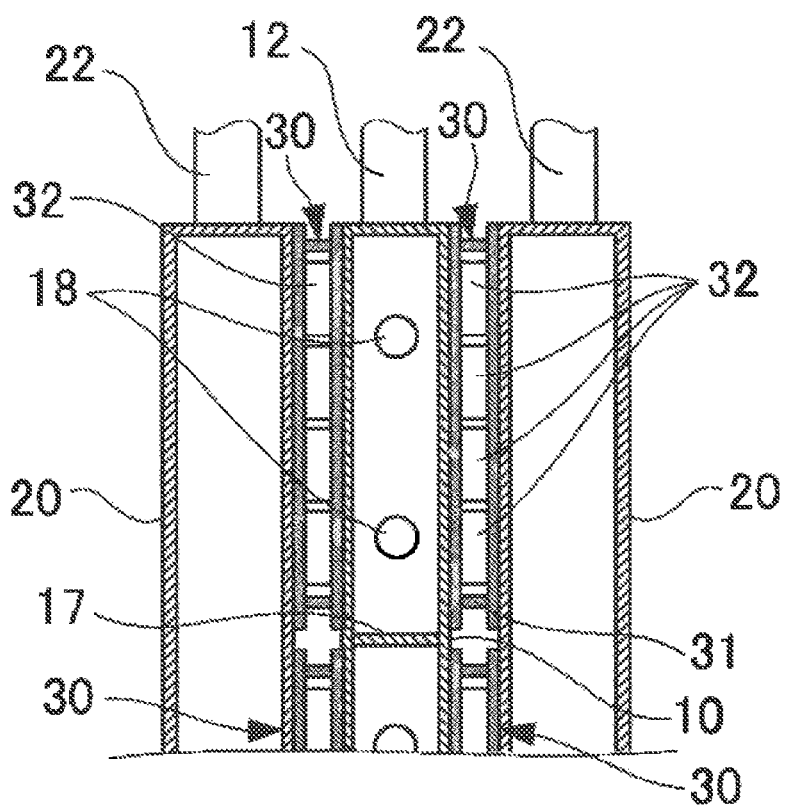

US 9,048,384 B2

STEAM GENERATION APPARATUS

BACKGROUND OF THE INVENTION

1. Field of the Invention

The present invention relates to a steam generation apparatus, and more particularly to a steam generation apparatus for generating steam simultaneously with thermoelectric generation.

2. Description of Related Art

The configuration of an example of conventional steam generation apparatuses is disclosed, for example, in WO 2011/121852A. The disclosed steam generation apparatus is provided, inside its housing, with pipe members through which a high-temperature heating medium passes, and a thermoelectric element module is attached on the surface of the pipe member. The thermoelectric element module is covered with a heat transfer plate, and water is ejected onto the surface of the heat transfer plate from a spray nozzle.

With the steam generation apparatus including the above-described configuration, water supplied to the heat transfer plate is heated by the high-temperature heating medium to produce water vapor, and at the same time, electric power can be generated using the temperature difference occurring in the thermoelectric element.

However, the above-described conventional steam generation apparatus has a problem of complication to make an insulating structure for reliably generating electric power obtained by the power generation using the thermoelectric element since the thermoelectric element is exposed to water vapor generated in the housing. The steam generation apparatus has another problem of a large amount of heat radiation to the outside of the pipe member, which in turn causes an excessive heat loss. The heat loss problem is particularly noticeable when a liquid medium having a high temperature of 200° C. or higher is used as the heating medium passing through the pipe member since heat transfer tends to increase when temperature difference between the external and internal temperatures of the pipe member is increased. Therefore, the conventional steam generation apparatus is still in need of improvement in terms of increased energy efficiency.

SUMMARY OF THE INVENTION

Therefore, it is an object of the present invention to provide a steam generation apparatus capable of maintaining high power generation performance for a long period of time.

The aforementioned object of the present invention can be achieved by a steam generation apparatus including: a high-temperature pipe disposed extending horizontally and through which a high-temperature fluid passes; low-temperature pipes disposed on both sides of the high-temperature pipe in a horizontal direction and through which a low-temperature fluid having a temperature lower than that of the high-temperature fluid passes; and a thermoelectric module interposed between the high-temperature pipe and each of the low-temperature pipes for generating electrical power using a temperature difference between the high-temperature pipe and the low-temperature pipes, the low-temperature pipes being configured such that the supplied low-temperature fluid in a liquid form is turned into steam due to heat exchange with the high-temperature fluid and is discharged from an upper portion of the low-temperature pipes.

Preferably, the steam generation apparatus further includes a level sensor for detecting a liquid level of the low-temperature fluid in the low-temperature pipes. Preferably, a plurality of the thermoelectric modules are assembled in a partitioned manner along the horizontal direction in which the high-temperature pipe extends. Also preferably, a heating element for melting the solidified high-temperature fluid is provided inside the high-temperature pipe.

Preferably, the steam generation apparatus further includes a vessel containing the high-temperature pipe, the low-temperature pipes and the thermoelectric module and the internal pressure of which can be reduced. In this configuration, the vessel preferably includes, at one longitudinal end thereof along the high-temperature pipe, a lid member capable of being opened and closed, and is preferably configured such that, as a result of the lid member being opened, the high-temperature pipe, the low-temperature pipes and the thermoelectric module can be conveyed to the outside of the vessel as an integrated unit along guide rails extending parallel to the high-temperature pipe.

The steam generation apparatus may further include a heat source supply apparatus for producing the high-temperature fluid heated by solar energy.

The steam generation apparatus may constitute a seawater desalination system for desalinating seawater using the steam produced from the low-temperature fluid as a heat source for distillation. Alternatively, the steam generation apparatus may constitute a seawater desalination system for desalinating seawater using the steam produced from the low-temperature fluid as a heat source for distillation and for desalinating seawater using the generated electric power for a reverse osmosis membrane method.

According to the present invention, it is possible to provide a steam generation apparatus capable of maintaining high power generation performance for a long period of time.

BRIEF DESCRIPTION OF THE DRAWINGS

FIG. 3 is an enlarged view showing a relevant part of the steam generation apparatus shown in FIG. 1.

FIG. 4 is an enlarged cross-sectional view of another relevant part of the steam generation apparatus shown in FIG. 1.

DETAILED DESCRIPTION OF THE INVENTION

Figure 1:
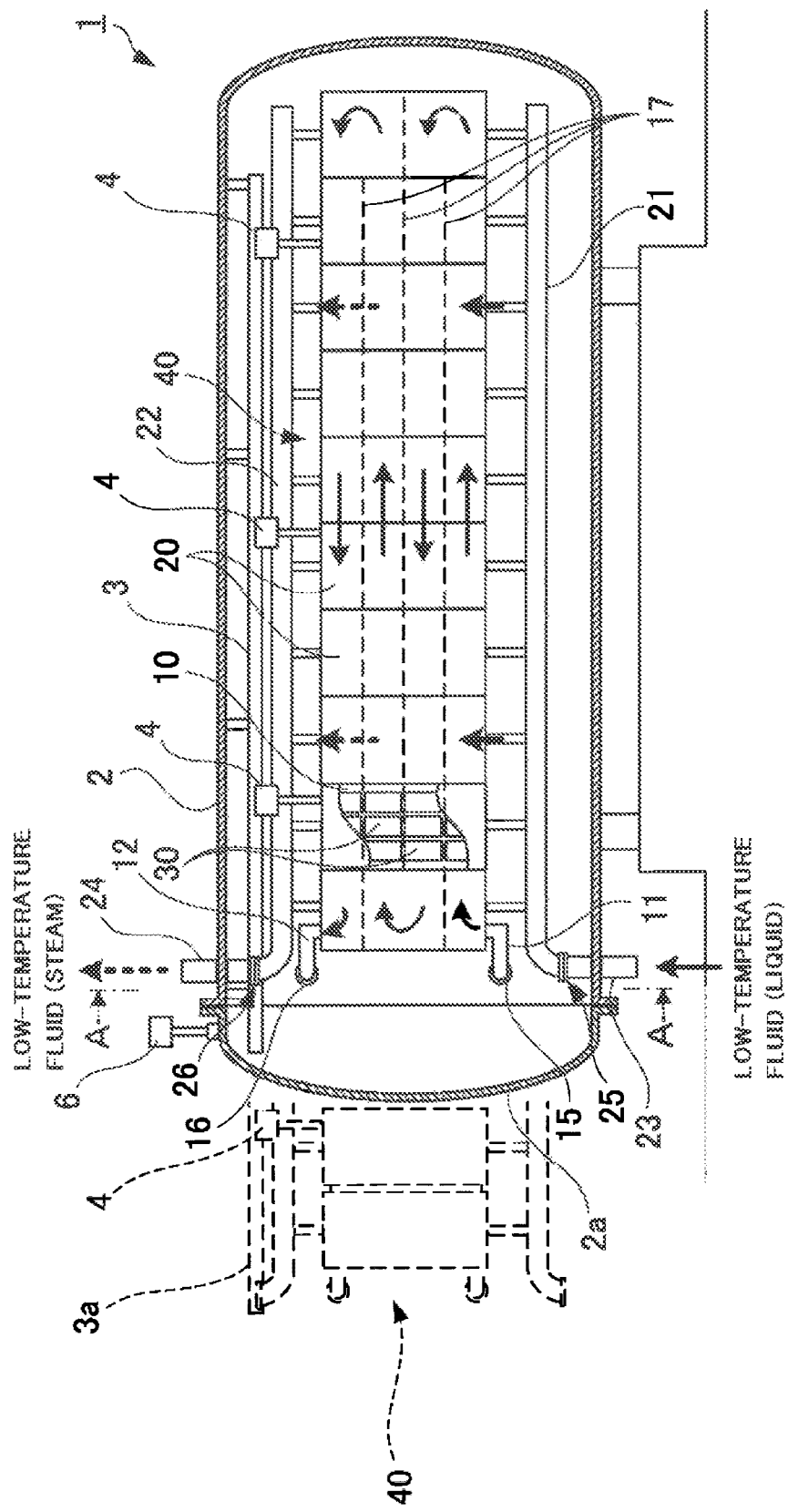
FIG. 1 is a schematic configuration diagram of a steam generation apparatus according to one embodiment of the present invention.
Figure 2:
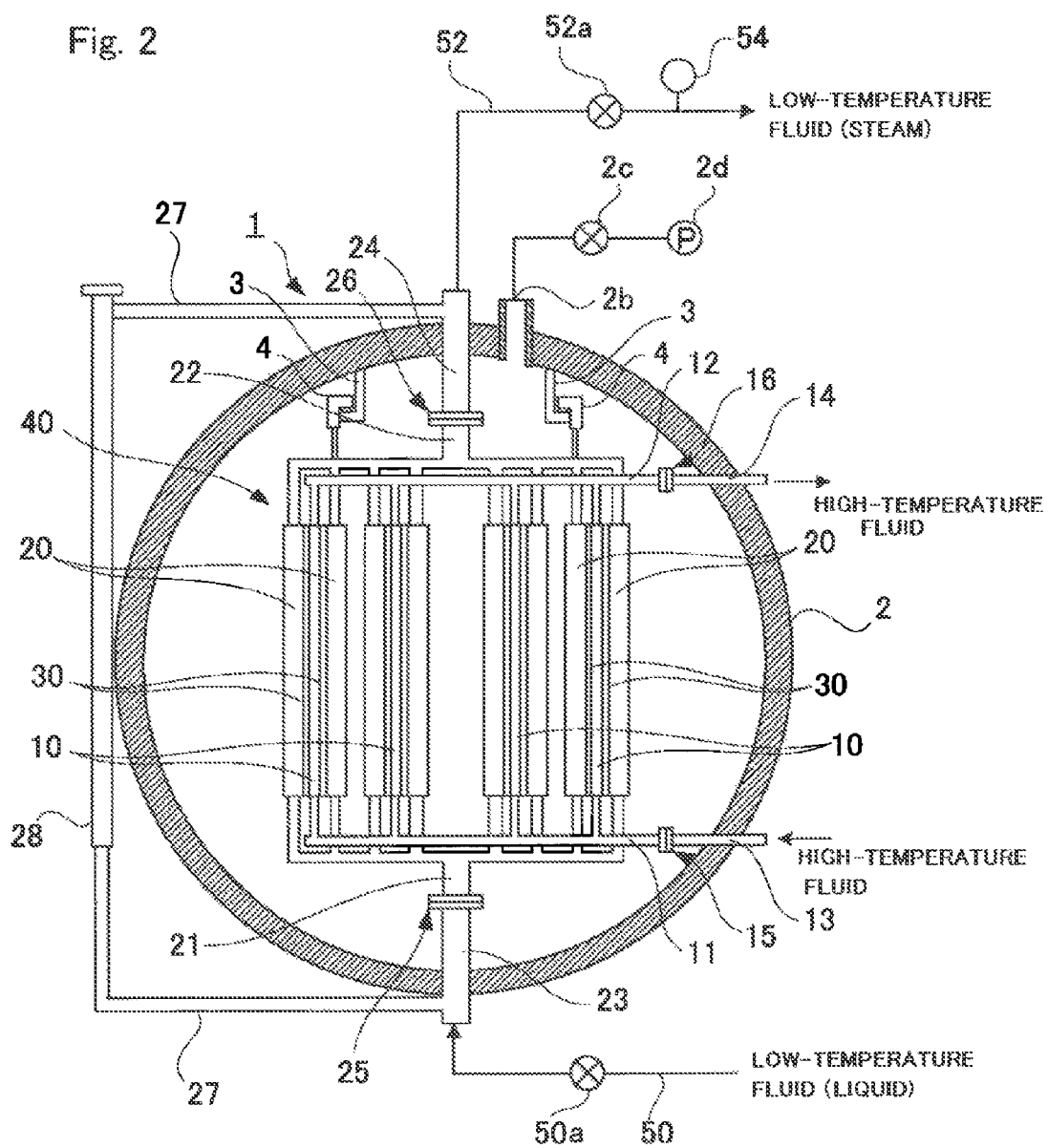
FIG. 2 is a cross-sectional view taken along the arrows A-A in FIG. 1.

Hereinafter, an embodiment of the present invention will now be described with reference to the accompanying drawings. FIG. 1 is a schematic configuration diagram of a steam generation apparatus according to one embodiment of the present invention. FIG. 2 is a cross-sectional view taken along the arrows A-A in FIG. 1. As shown in FIGS. 1 and 2, a steam generation apparatus 1 is configured by containing, inside a vessel 2, a main body 40 including high-temperature pipes 10, low-temperature pipes 20 and thermoelectric units 30. The vessel 2, which has a cylindrical shape, includes, at one longitudinal end thereof, a lid head plate 2*a* capable of being opened and closed, and is installed horizontally on a floor or the like. A vent outlet 2*b* of the vessel 2 is connected via a valve 2*c* to a suction device 2*d* such as a vacuum pump or a steam ejector, and the pressure inside the vessel 2 can be reduced to a vacuum state by discharging air by the suction device 2*d*. The inner surface of the vessel 2 is laminated with aluminum or mirror finished so as to be able to suppress heat radiation to the outside of the vessel 2.

A plurality of high-temperature pipes 10, each having a flat rectangular section, are disposed extending along the longitudinal direction of the vessel 2. The branched portions of branch pipes 11 and 12, each having a plurality of branched portions, are connected to the lower portion and the upper portion, respectively, of the high-temperature pipes 10 at one longitudinal end thereof, The branch pipes 11 and 12 are connected, via flange portions 15 and 16, respectively, to a high-temperature fluid feed pipe 13 and a high-temperature fluid outlet pipe 14, respectively, which are fixed to the side wall of the vessel 2, thus providing a configuration that allows a high-temperature fluid to be supplied from the lower portion and be discharged from the upper portion of the high-temperature pipes 10. As indicated by a dashed line in FIG. 1, the interior of each of the high-temperature pipes 10 is divided into vertically arranged sections by partition walls 17, forming a high-temperature fluid flow channel such that the high-temperature fluid flowing along the high-temperature pipes 10 rises at the ends, turns back, and moves back and forth in this manner. Preferably, the high-temperature fluid is a liquid heated to 200° C. or higher (preferably 300° C. or higher) and having a large heat capacity. Specific examples thereof include molten salt, oil, and molten metal. Although there is no particular limitation with respect to the production of the high-temperature fluid, it is preferable to use an apparatus that produces the high-temperature fluid heated by solar energy, as will be described below.

The low-temperature pipes 20 are disposed on both sides of each of the high-temperature pipes 10 in the horizontal direction thereof (that is, both sides of the rectangular section in the shorter direction), and a plurality of the low-temperature pipes 20 are provided in a partitioned manner along the horizontal direction in which the high-temperature pipes 10 extend. In order to reduce the radiation heat loss from the high-temperature pipes 10 to a minimum, the low-temperature pipes 20 are preferably disposed so as to cover the entire side wall of the high-temperature pipes 10 without any gap. The branched portions of branch pipes 21 and 22, each having a plurality of branched portions, are connected to the lower portion and the upper portion, respectively, of the low-temperature pipes 20. The branch pipes 21 and 22 are connected, via flange portions 25 and 26, respectively, to a low-temperature fluid feed pipe 23 and a low-temperature fluid outlet pipe 24, respectively, which are fixed to the side wall of the vessel 2, thus providing a configuration that allows a low-temperature fluid to be supplied from the lower portion and be discharged from the upper portion of the low-temperature pipes 20. The low-temperature fluid supplied to the low-temperature pipes 20 preferably may be, for example, a liquid having a large heat capacity, such as water, and steam that has been heated due to heat exchange between fluids in the low-temperature pipes 20 and the high-temperature pipes 10 is discharged from the low-temperature pipes 20.

As shown in FIG. 2, a level sensor 28 is connected to the low-temperature fluid feed pipe 23 and the low-temperature fluid outlet pipe 24 via a communicating pipe 27, parallel to the low-temperature pipes 20. The level sensor 28 is disposed outside of the vessel 2 so that it can detect the liquid level inside the low-temperature pipes 20. The low-temperature fluid feed pipe 23 and the low-temperature fluid outlet pipe 24 are connected to an inlet pipe 50 and an outlet pipe 52, respectively. Control valves 50a and 52a are provided in the inlet pipe 50 and the outlet pipe 52, respectively. Further, the outlet pipe 52 is provided with a temperature sensor (or pressure sensor) 54 for detecting the temperature (or pressure) of the steam passing through the outlet pipe 52. A control unit (not shown) adjusts the opening of the control valves 50a of the inlet pipe 50 such that the liquid level inside the low-temperature pipe 20 detected by the level sensor 28 is maintained in a predetermined height range, and also adjusts the opening of the control valve 52a of the outlet pipe 52 based on the detection performed by the temperature sensor (or pressure sensor) 54 such that the temperature or pressure of the steam passing through the outlet pipe 52 is maintained at a desired value. Thereby, the temperature or pressure of the generated steam can be set and adjusted in accordance with the intended use of the generated steam on the downstream side.

The thermoelectric units 30 are disposed on both sides of each of the high-temperature pipes 10 in the horizontal direction (i.e., both sides of the rectangular cross section in the shorter direction), and are interposed between the high-temperature pipe 10 and the low-temperature pipe 20. As shown in FIG. 3, the low-temperature pipe 20 and the thermoelectric unit 30 can be attached to the high-temperature pipe 10, for example, by inserting a bolt 41 fixed to the surface of the high-temperature pipe 10 through a bolt hole 20b formed in a flange portion 20a of the low-temperature pipe 20, followed by further inserting the bolt 41 through a coil spring 42, and screwing a nut 43 such that the coil spring 42 is sufficiently compressed. Attaching a plurality of portions of the low-temperature pipe 20 to the high-temperature pipe 10 using this assembling method makes it possible to have a reliable contact pressure of the thermoelectric unit 30 between the high-temperature pipe 10 and the low-temperature pipe 20 by the biasing force of the coil spring 42, and keep pressing the low-temperature pipe 20 even if the bolt 41 is thermally expanded due to heat dissipation from the high-temperature pipe 10 as long as the coil spring 42 is maintained in a compressed state. That is, it is possible to reliably prevent a reduction in the contact pressure of the thermoelectric unit 30 by deformation due to a large temperature difference ranging from low temperatures to high temperatures, thereby achieving stable power generation performance.

As shown in the cross-sectional view in FIG. 4, each of the thermoelectric units 30 includes a plurality of thermoelectric modules 32 disposed inside a seal member 31 made of an electrically insulating material or the like in a matrix configuration. Each of the thermoelectric modules 32 has a known configuration in which a plurality of p-type semiconductor elements and n-type semiconductor elements (both not shown) that are alternately connected with electrodes interposed therebetween, and is disposed so as to generate electrical power using a temperature difference between the high-temperature pipe 10 and the low-temperature pipe 20. The size of the thermoelectric modules 32 is, for example, 50 mm×50 mm. In this embodiment, eight thermoelectric modules 32 constitute a thermoelectric unit 30 having substantially the same size as that of a low-temperature pipe 20. The durability of the elements can be increased by preventing their degradation by sealing the interior space of the seal member 31 into a vacuum, or enclosing a gas therein. However, it is also possible to adopt a configuration in which the seal member 31 is omitted, in order to promote heat conduction from the high-temperature pipes 10 to the low-temperature pipes 20, thereby reducing radiation heat loss. By disposing the small-sized thermoelectric modules 32 between the high-temperature pipe 10 and the low-temperature pipe 20 as in this embodiment, the thermoelectric modules 32 can be individually pressed to the high-temperature pipes 10 and the low-temperature pipes 20. Accordingly, it is possible to reduce radiation heat loss and thus achieve high power generation efficiency.

As shown in the partial cutaway view of a low-temperature pipe 20 in FIG. 1, a plurality of the thermoelectric units 30 are arranged in a matrix configuration by being assembled in a partitioned manner along the high-temperature pipe 10 and also along the vertical direction, which is orthogonal to the high-temperature pipe 10. Electric power can be supplied to the outside of the vessel 2 by connecting adjacent thermoelectric units 30 either in series or parallel using lead wire (not shown). By arranging a plurality of thermoelectric units 30 each constituted by a plurality of thermoelectric modules 32 as in this embodiment, operations such as maintenance, repair and replacement can be performed promptly and easily for the thermoelectric units 30 on a unit-by-unit basis. However, the unitization of the thermoelectric modules 32 is not essential for the present invention, and the thermoelectric modules 32 may be separately disposed on the surface of the high-temperature pipes 10. In this case as well, it is preferable to dispose the thermoelectric modules 32 sequentially along the horizontal direction in which the high-temperature pipes 10 extend.

There is no particular limitation with respect to the materials for the p-type semiconductor elements and the n-type semiconductor elements of the thermoelectric modules 32, and the materials may be appropriately selected from known materials according to the temperature of the high-temperature pipes 10 in which the thermoelectric modules 32 are disposed. For example, Bi—Te materials can be used for a low-temperature range, and suicide materials can be used for a high-temperature range. In the case where the temperature of the high-temperature pipes 10 is high (for example, 300° C. or higher), the thermoelectric modules 32 may be cascaded with two types of high temperature and low temperature semiconductor materials so as to allow for thermoelectric generation in a wide temperature range from a high-temperature range to a low-temperature range, which makes it possible to increase the thermoelectric generation efficiency. Furthermore, since the high-temperature pipes 10 have a temperature gradient along the flow direction of the high-temperature fluid, the selection of the semiconductor materials for the thermoelectric modules 32 can be made individually, according to the area of the high-temperature pipes 10 where the thermoelectric modules 32 are disposed. This configuration makes it possible to increase the power generation efficiency of the individual thermoelectric modules 32, and therefore a thermoelectric unit 30 and an assembly thereof that can utilize the temperature difference highly efficiently can be obtained.

As shown in FIG. 4, heating elements 18 each composed of an electric heater, a high-temperature steam pipe, or the like are disposed inside the flow channel formed inside the high-temperature pipes 10 such that they extend along the high-temperature pipes 10. Note that the high-temperature pipes 10 are further provided with a drain (not shown) and the high-temperature fluid can be discharged to the outside in an unused state, for example, at the time of stoppage.

As shown in FIGS. 1 and 2, the main body 40, which includes the high-temperature pipes 10, the low-temperature pipes 20 and the thermoelectric units 30 described above, is suspended from and supported by two guide rails 3 fixed to the inner upper face of the vessel 2, via a plurality of support members 4. The support members 4 are configured such that their lower end is fixed to the upper portion of the main body 40 (for example, the high-temperature pipe 10) and their upper end is movable along the guide rails 3. Also, the lid head plate 2a of the vessel 2 is supported by a suspender (not shown) so as to be removable, for example, by being rotated. The guide rails 3 are configured to be extendable by means of, for example, a telescopic structure, so that conveyor rails 3a can be extended to the outside of the vessel 2 as indicated by a broken line in FIG. 1 in a state in which the lid head plate 2a is removed. Rather than being extended from the guide rails 3, the conveyor rails 3a may be connected to the guide rails 3 from the outside of the vessel 2 and supported by a strut (not shown) or the like.

With the steam generation apparatus 1 having the above-described configuration, the lid head plate 2a of the vessel 2 is closed and the pressure inside the vessel 2 is reduced to a vacuum. Thereafter, a high-temperature fluid and a low-temperature fluid are supplied to the high-temperature pipes 10 and the low-temperature pipes 20, respectively. Consequently, heat is exchanged between the high-temperature fluid and the low-temperature fluid, and the resulting water vapor is discharged from the low-temperature fluid outlet pipe 24. Concurrently with this, a temperature difference occurs in the thermoelectric units 30, and therefore electric power can be drawn to the outside.

With the steam generation apparatus 1 according to this embodiment, the high-temperature fluid and the low-temperature fluid pass through the inside of the high-temperature pipe 10 and the low-temperature pipe 20, respectively, and therefore the thermoelectric units 30 can be disposed so as to be isolated from the high-temperature fluid and the low-temperature fluid. Accordingly, there is no possibility that thermoelectric units 30 are exposed to liquid or steam and therefore an electric short-circuit is less likely to occur, making it possible to eliminate the above-described problem of complication of the insulating structure.

Furthermore, with the configuration in which the low-temperature pipes 20 are disposed on both sides of the high-temperature pipes 10 in the horizontal direction with the thermoelectric units 30 interposed therebetween, it is easy to reduce the area where the surface of the high-temperature pipes 10 is exposed, thus suppressing heat dissipation loss and ensuring a sufficient temperature difference for the thermoelectric units 30. Moreover, the region where the thermoelectric units 30 can be disposed is increased, and it is therefore possible to increase the power generation efficiency. In particular, by forming the high-temperature pipes 10 to have a flat rectangular cross section as in this embodiment, it is possible to minimize the heat dissipation loss in the case where the high-temperature pipes 10 are extended in the longitudinal direction or where a plurality of high-temperature pipes 10 are arranged parallel, and therefore it is possible to increase the compactness and the efficiently of the steam generation apparatus 1. That is, in the case of increasing the amount of power generation and steam generation of the steam generation apparatus 1, an increase in the exposed area of the high-temperature pipes 10 can be effectively suppressed by extending the high-temperature pipes 10 in the horizontal direction and disposing the thermoelectric units 30 and the low-temperature pipes 20 on both sides of the extended portion of the high-temperature pipes 10 in the horizontal direction without any gap. This configuration can significantly reduce the heat dissipation loss from the high-temperature pipes, as compared to a configuration in which a plurality of high-temperature pipes and low-temperature pipes are alternately disposed and stacked, and therefore can increase the power generation efficiency and the steam generation efficiency. Furthermore, even in the case where a plurality of high-temperature pipes 10 are disposed, operations such as repair and replacement can be performed simply by removing the low-temperature pipe 20 covering the thermoelectric unit 30 for which such operation is performed, thus increasing the ease of maintenance.

Since the inside of the vessel 2 is brought into a vacuum atmosphere by pressure reduction, heat radiation due to a convection current from the high-temperature pipes 10 does not occur and therefore the heat loss can be further reduced. Also, it is possible to prevent the oxidation of the thermoelectric units 30 in a reliable manner, thus maintaining a good durability. Preferably, the inner surface of the vessel 2 is subjected to a reflection treatment such as mirror finishing or a treatment with aluminum as in this embodiment, and the power generation efficiency can be further increased by reducing the radiant heat of the high-temperature pipes 10. In the case where the main body 40 is housed in the vessel 2 as in this embodiment, a dry, insulated space having a low temperature environment can be formed inside the vessel 2. This facilitates the installation of wiring (especially for high power equipment) for collecting electric power generated by the thermoelectric units 30 and of instrumentation wiring for detecting temperature, voltage, current or the like. Note, however, that the vessel 2 is not essential for the present invention, and it is also possible to adopt a configuration in which the vessel 2 is not provided.

Furthermore, with a configuration in which the liquid level in the low-temperature pipes 20 can be detected by the level sensor 28, the liquid level in the low-temperature pipe 20 can be maintained in a predetermined range, for example, by adjusting the opening of the control valves 50a based on the detection, and therefore a good power generation performance of the thermoelectric units 30 can be maintained.

By disposing the thermoelectric units 30 in a partitioned manner along the high-temperature pipes 10, the restoration work in the case of failure of the thermoelectric unit 30 can be performed promptly and easily. The outputs of the thermoelectric units 30 may be detected by a voltage detector or the like, either individually or for every predetermined group, making it possible to readily identify the failed thermoelectric unit 3 and perform the repair work efficiently.

As indicated by the dashed line in FIG. 1, with the steam generation apparatus 1 according to this embodiment, the main body 40, in which the high-temperature pipes 10, the low-temperatures pipe 20 and the thermoelectric units 30 are integrated, can be moved along the guide rails 3 by opening the lid head plate 2a of the vessel 2 and then disconnecting the flange portions 15, 16, 25, and 26. Then, as shown in FIG. 1, the main body 40 can be moved to the outside of the vessel 2 along the guide rails 3 and the conveyor rails 3a either by extending the conveyor rails 3a from the guide rails 3 to the outside of the vessel 2, or by connecting the conveyor rails 3a to the guide rails 3 from the outside of the vessel 2. Accordingly, operations such as repair and replacement of the thermoelectric units 30 can be more easily performed. This configuration is particularly effective when the high-temperature pipes 10 are long and a plurality of thermoelectric units 30 are disposed along the high-temperature pipes 10 as in this embodiment. Note that a flexible pipe (not shown) for reducing thermal deformation may be interposed within each of the flange portions 15, 16, 25, and 26. In this case, the main body 40 can be moved by removing the flexible pipes.

In the case of using molten salt as the high-temperature fluid, the molten salt solidifies when its temperature decreases to approximately 140° C. or lower after the steam generation apparatus 1 is stopped, and therefore it may be difficult to restart the steam generation apparatus 1. In such a case, the high-temperature fluid can be remelted by operating the heating elements 18 inside the high-temperature pipes 10 to ensure the fluidity, and therefore it is possible to prevent a malfunction at the time of restarting the operation.

Figure 5:
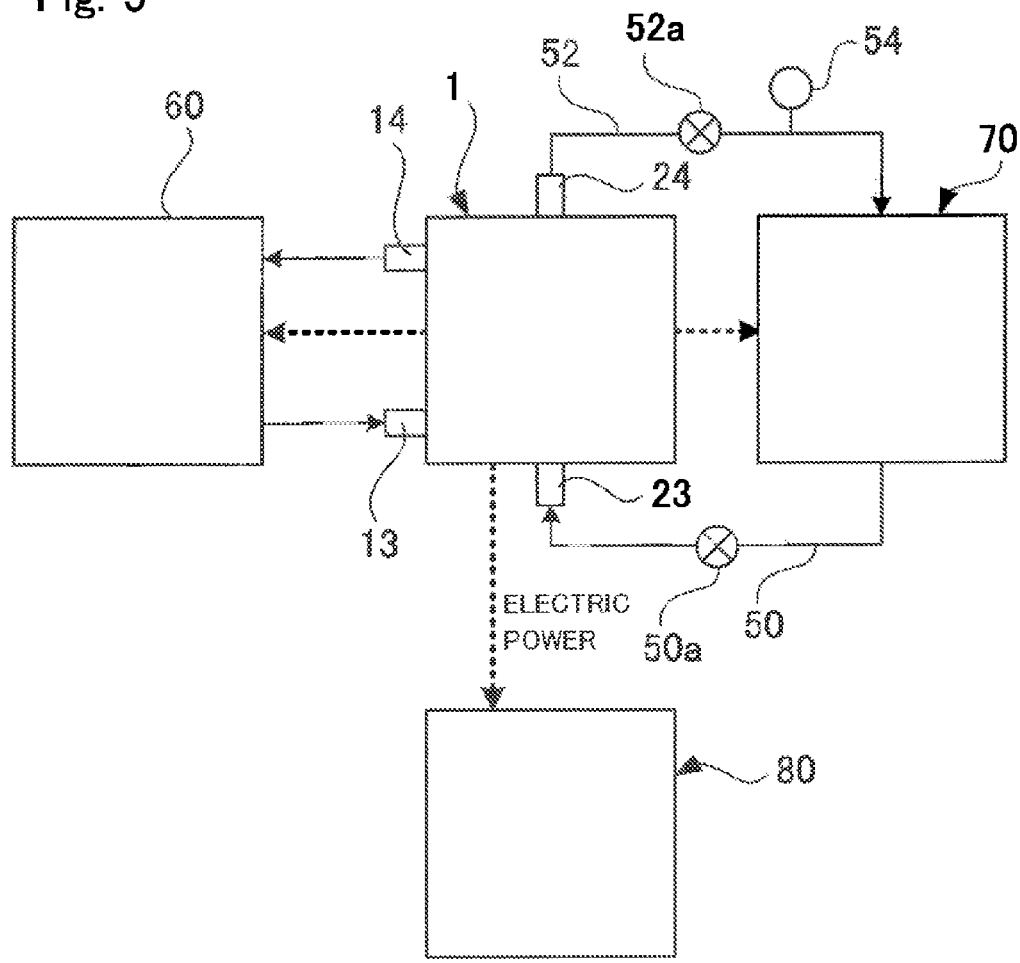
FIG. 5 is a schematic configuration diagram showing an example of seawater desalination system using the steam generation apparatus shown in FIG. 1.

As shown in FIG. 5, by providing the steam generation apparatus 1 described thus far with with a heat source supply apparatus 60 for generating a high-temperature fluid by heating a heating medium with solar energy, it is possible to easily provide a large amount of high-temperature fluid that has been heated to a required temperature. The specific configuration of the heat source supply apparatus 60 is known, and is disclosed, for example, in WO 2011/121852A. The high-temperature fluid heated in the heat source supply apparatus 60 is supplied to the high-temperature fluid feed pipe 13 (see FIG. 2) of the steam generation apparatus 1, then used for power generation and steam generation, and thereafter supplied from the high-temperature fluid outlet pipe 14 (see FIG. 2) to the heat source supply apparatus 60 for reheating.

Furthermore, as shown in FIG. 5, the steam generation apparatus 1 may be combined with an thermal seawater desalination apparatus 70 to form a seawater desalination system. Examples of the methods used for the thermal seawater desalination apparatus 70 include multi-stage flash distillation and multi-effect distillation. The thermal seawater desalination apparatus 70 desalinates seawater by distillation using, as its heat source, the steam from the low-temperature fluid introduced from the low-temperature fluid outlet pipe 24 (see FIG. 2) of the steam generation apparatus 1. The steam from the low-temperature fluid that has undergone heat exchange with seawater is condensed, and thereafter supplied to the low-temperature pipes 20 again from the low-temperature fluid feed pipe 23 (see FIG. 2) of the steam generation apparatus 1. The steam temperature of the low-temperature fluid introduced to the thermal seawater desalination apparatus 70 is preferably set in a temperature range of 50 to 185° C. In particular, setting the steam temperature of the low-temperature fluid to 140 to 185° C. (e.g., 175° C.) makes it possible to reuse part of the steam from the low-temperature fluid that has been used for the seawater desalination process for the desalination process by means of a steam ejector, thus increasing the processing capability. As described above, the steam temperature of the low-temperature fluid introduced to the thermal seawater desalination apparatus 70 can be maintained at a desired temperature by adjusting the openings of the control valves 50a and 52a (see FIG. 2) of the inlet pipe 50 and the outlet pipe 52.

The seawater desalination system shown in FIG. 5 further includes a reverse osmosis membrane-based seawater desalination apparatus 80. The reverse osmosis membrane-based seawater desalination apparatus 80 includes various pumps (not shown) for intake of seawater, permeation of seawater through the reverse osmosis membrane, delivery of the produced fresh water, and so forth. By driving these pumps and the like using electric power generated by the steam generation apparatus 1, it is possible to realize effective utilization of energy while avoiding constraints imposed by the location conditions. In the seawater desalination system shown in FIG. 5, the electric power generated by the steam generation apparatus 1 can also he used for operating the heat source supply apparatus 60 and the thermal seawater desalination apparatus 70.1

The invention claimed is:

1. A steam generation apparatus comprising:
a high-temperature pipe disposed extending horizontally and through which a high-temperature fluid passes;
low-temperature pipes disposed on both sides of said high-temperature pipe in a horizontal direction and through which a low-temperature fluid having a temperature lower than that of the high-temperature fluid passes; and a thermoelectric module interposed between said high-temperature pipe and each of said low-temperature pipes for generating electrical power using a temperature difference between said high-temperature pipe and said low-temperature pipes, wherein said low-temperature pipes are configured such that said supplied low-temperature fluid in a liquid form is turned into steam due to heat exchange with said high-temperature fluid and is discharged from an upper portion of said low-temperature pipes.

2. The steam generation apparatus according to claim 1, further comprising a level sensor for detecting a liquid level of said low-temperature fluid in said low-temperature pipes.

3. The steam generation apparatus according to claim 1, wherein a plurality of said thermoelectric modules are assembled in a partitioned manner along the horizontal direction in which said high-temperature pipe extends.

4. The steam generation apparatus according to claim 1, wherein a heating element for melting the solidified high-temperature fluid is provided inside said high-temperature pipe.

5. The steam generation apparatus according to claim 1, further comprising a vessel containing said high-temperature pipe, said low-temperature pipes and said thermoelectric module and the internal pressure of which can be reduced.

6. The steam generation apparatus according to claim 5, wherein said vessel comprises at one longitudinal end thereof along said high-temperature pipe, a lid member capable of being opened and closed, and wherein said high-temperature pipe, said low-temperature pipes and said thermoelectric module can be conveyed to the outside of said vessel as an integrated unit along guide rails extending parallel to said high-temperature pipe as a result of said lid member being opened.

7. The steam generation apparatus according to claim 1, further comprising a heat source supply apparatus for producing said high-temperature fluid heated by solar energy.

8. A seawater desalination system for desalinating seawater by distillation using the steam produced from said low-temperature fluid in said steam generation apparatus according to claim 1 as a heat source.

9. A seawater desalination system for desalinating seawater by distillation using the steam produced from said low-temperature fluid in said steam generation apparatus according to claim 1 as a heat source and for desalinating seawater by a reverse osmosis membrane method using the electric power generated in said steam generation apparatus according to claim 1.

* * * * *